(12) United States Patent
Nihei et al.

(10) Patent No.: US 9,369,117 B2
(45) Date of Patent: Jun. 14, 2016

(54) DELAY CIRCUIT, OSCILLATION CIRCUIT, AND SEMICONDUCTOR DEVICE

(71) Applicant: Seiko Instruments Inc., Chiba-shi, Chiba (JP)

(72) Inventors: Yotaro Nihei, Chiba (JP); Tomoyuki Yokoyama, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 14/976,626

(22) Filed: Dec. 21, 2015

(65) Prior Publication Data

US 2016/0112038 A1 Apr. 21, 2016

(30) Foreign Application Priority Data

Jun. 28, 2013 (JP) .................................. 2013-136989
May 2, 2014 (JP) .................................. 2014-095316

(51) Int. Cl.
*H03K 5/12* (2006.01)
*H03B 5/24* (2006.01)

(52) U.S. Cl.
CPC ..... *H03K 5/12* (2013.01); *H03B 5/24* (2013.01)

(58) Field of Classification Search
CPC .................................. H03K 5/12; H03K 5/24
USPC .................................................. 331/111, 143
See application file for complete search history.

(56) References Cited

U.S. PATENT DOCUMENTS

| | | | | |
|---|---|---|---|---|
| 4,972,162 A | * | 11/1990 | Banu ...................... | H03K 3/354 331/111 |
| 6,903,590 B2 | | 6/2005 | Indoh | |
| 2006/0038625 A1 | * | 2/2006 | Ricard ................... | G11C 5/145 331/143 |

FOREIGN PATENT DOCUMENTS

| | | |
|---|---|---|
| JP | 54-142962 A | 11/1979 |
| JP | 06-224705 A | 8/1994 |
| JP | 2003-008410 A | 1/2003 |
| JP | 2008-271526 A | 11/2008 |

OTHER PUBLICATIONS

International Search Report, and English translation thereof, in corresponding International Application No. PCT/JP2014/066453 dated Sep. 16, 2014, 5 pages.

* cited by examiner

*Primary Examiner* — Joseph Chang
(74) *Attorney, Agent, or Firm* — Brinks Gilson & Lione (57) ABSTRACT

Provided is a voltage regulator which consumes low power and uses an NMOS transistor as an output transistor. A delay circuit includes, between a constant current circuit and a capacitor, a depletion type NMOS transistor having a gate and a back gate each connected to a ground terminal, the constant current circuit including a depletion type NMOS transistor and a resistor connected between each of a gate and a back gate of the depletion type NMOS transistor and a source thereof.

5 Claims, 7 Drawing Sheets

DELAY CIRCUIT, OSCILLATION CIRCUIT, AND SEMICONDUCTOR DEVICE

RELATED APPLICATIONS

The present application is a continuation of International Application PCT/JP2014/066453, with an international filing date of Jun. 20, 2014, which claims priority to Japanese Patent Applications No. 2013-136989 filed on Jun. 28, 2013 and No. 2014-095316 filed on May 2, 2014, the entire contents of which are incorporated herein by reference.

BACKGROUND OF THE INVENTION

1. Technical Field

The present invention relates to a delay circuit, and an oscillator circuit and a semiconductor device each including the delay circuit.

2. Background Art

Figure 4:
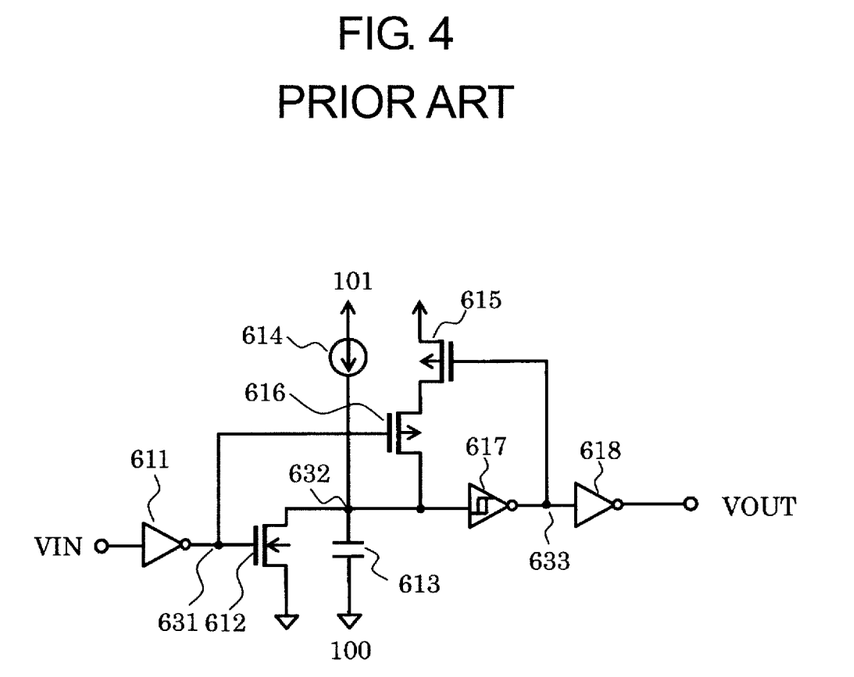
FIG. 4 is a circuit diagram for illustrating a related-art delay circuit.

A related-art delay circuit is now described. FIG. 4 is a circuit diagram for illustrating the related-art delay circuit.

The related-art delay circuit includes inverters 611, 617, and 618, an NMOS transistor 612, PMOS transistors 615 and 616, a capacitor 613, a constant current circuit 614, an input terminal VIN, an output terminal VOUT, a power supply terminal 101, and a ground terminal 100.

Figure 5:
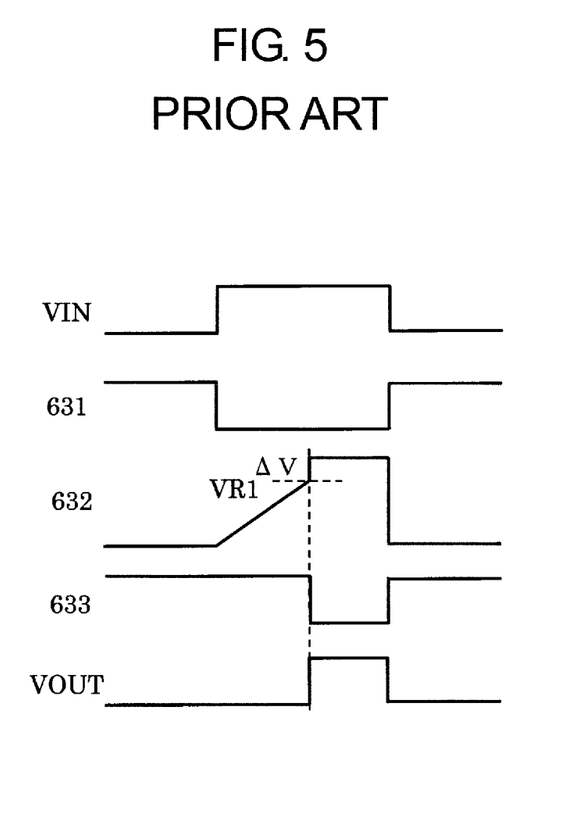
FIG. 5 is a timing chart for illustrating operation of the related-art delay circuit.

FIG. 5 is a timing chart for illustrating operation of the related-art delay circuit.

After a power supply voltage VDD of the power supply terminal 101 is raised, when a voltage of the input terminal VIN is Low, a voltage of a node 631 becomes High to turn on the NMOS transistor 612 and turn off the PMOS transistor 616. The capacitor 613 is discharged due to the NMOS transistor 612 being turned on, and a node 632 becomes Low. At this time, because an inverted output of the inverter 617 is High, a voltage of a node 633 becomes High. Accordingly, the PMOS transistor 615 is turned off and a voltage of the output terminal VOUT becomes Low.

When the voltage of the input terminal VIN is changed to High, the voltage of the node 631 becomes Low to turn off the NMOS transistor 612 and turn on the PMOS transistor 616. The capacitor 613 starts to be charged when the NMOS transistor 612 is turned off, and hence the voltage of the node 632 is increased. Then, when the voltage of the node 632 exceeds a detection voltage VR1 of the inverter 617, the voltage of the node 633 becomes Low to turn on the PMOS transistor 615, and the voltage of the output terminal VOUT is changed to High. In this way, a time (Td) from a time point at which the voltage of the input terminal VIN is changed from Low to High to when the voltage of the node 632 exceeds the detection voltage VR1 is delayed, to thereby change the voltage of the output terminal VOUT from Low to High (for example, see Patent Literature 1).

CITATION LIST

Patent Literature

[PTL 1] JP 2004-260730 A

SUMMARY OF THE INVENTION

Technical Problem

However, the related-art delay circuit has a problem in that the time (Td) until the voltage of the node 632 exceeds the detection voltage VR1 varies, and it is thus difficult to accurately set a delay time lasting from when the voltage of the input terminal VIN is changed from Low to High to when the voltage of the output terminal VOUT is changed from Low to High.

The present invention has been made in view of the above-mentioned problem, and provides a delay circuit capable of accurately setting a delay time from when a voltage of an input terminal VIN is changed to when a voltage of an output terminal VOUT is changed.

Solution to Problem

In order to solve the related-art problem, a delay circuit according to one embodiment of the present invention has the following configurations.

The delay circuit includes, between a constant current circuit and a capacitor, a depletion type NMOS transistor having a gate and a back gate each connected to a ground terminal, the constant current circuit including a depletion type NMOS transistor and a resistor connected between each of a gate and a back gate of the depletion type NMOS transistor and a source thereof.

Advantageous Effects of the Invention

The delay circuit according to the one embodiment of the present invention includes, between the constant current circuit and the capacitor, the depletion type NMOS transistor having the gate and the back gate each connected to the ground terminal, and hence the delay circuit can accurately set the delay time only by the resistor of the constant current circuit and the capacitor.

DETAILED DESCRIPTION OF THE PREFERRED EMBODIMENTS

Figure 1:
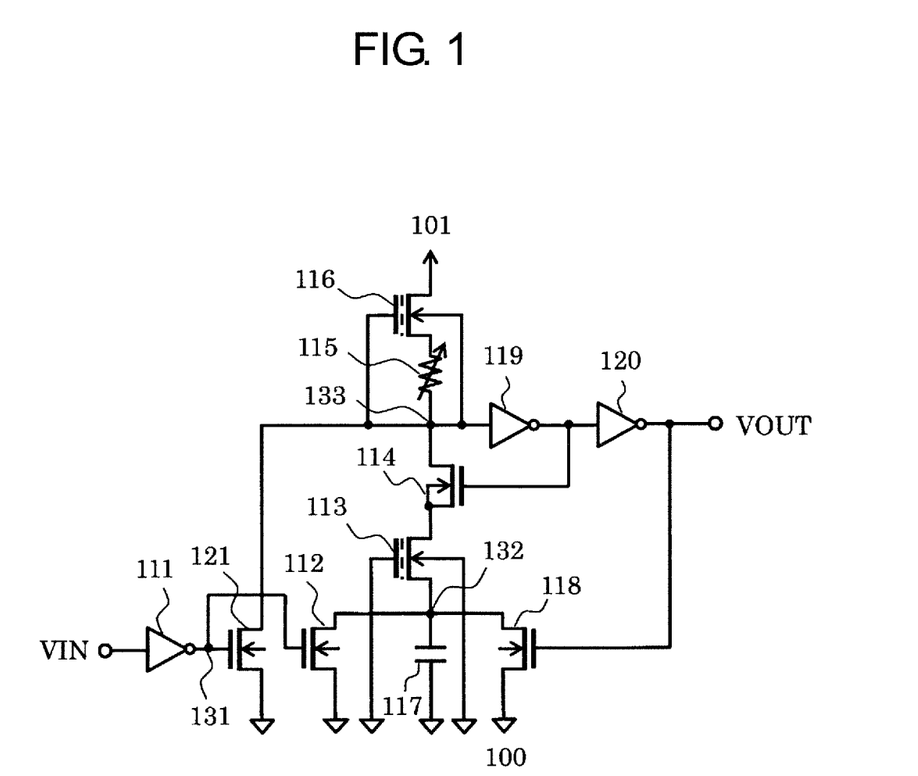
FIG. 1 is a circuit diagram for illustrating a delay circuit according to an embodiment of the present invention.

FIG. 1 is a circuit diagram for illustrating a delay circuit according to an embodiment of the present invention.

The delay circuit of this embodiment includes inverters 111, 119, and 120, NMOS transistors 112, 118, 114, and 121, depletion type NMOS transistors 113 and 116, a capacitor 117, a resistor 115, an input terminal VIN, an output terminal VOUT, a power supply terminal 101, and a ground terminal 100.

Next, connections in the delay circuit of this embodiment are described.

The inverter 111 has an input connected to the input terminal VIN and an output connected to a gate of the NMOS transistor 112 and a gate of the NMOS transistor 121 via a node 131. The NMOS transistor 112 has a drain connected to a node 132 and a source connected to the ground terminal 100. The NMOS transistor 121 has a drain connected to a node 133 and a source connected to the ground terminal 100. The capacitor 117 has one terminal connected to the node 132 and the other terminal connected to the ground terminal 100. The depletion type NMOS transistor 113 has a gate and a back gate each connected to the ground terminal 100, a drain connected to a source and a back gate of the NMOS transistor 114, and a source connected to the node 132. The NMOS transistor 118 has a gate connected to the output terminal VOUT, a drain connected to the node 132, and a source connected to the ground terminal 100. The NMOS transistor 114 has a gate connected to an output of the inverter 119 and a drain connected to the node 133. The resistor 115 is connected between a source of the depletion type NMOS transistor 116 and the node 133. The depletion type NMOS transistor 116 has a gate and a back gate each connected to the node 133 and an input of the inverter 119, and a drain connected to the power supply terminal 101. The inverter 120 has an input connected to the output of the inverter 119 and an output connected to the output terminal VOUT.

Figure 2:
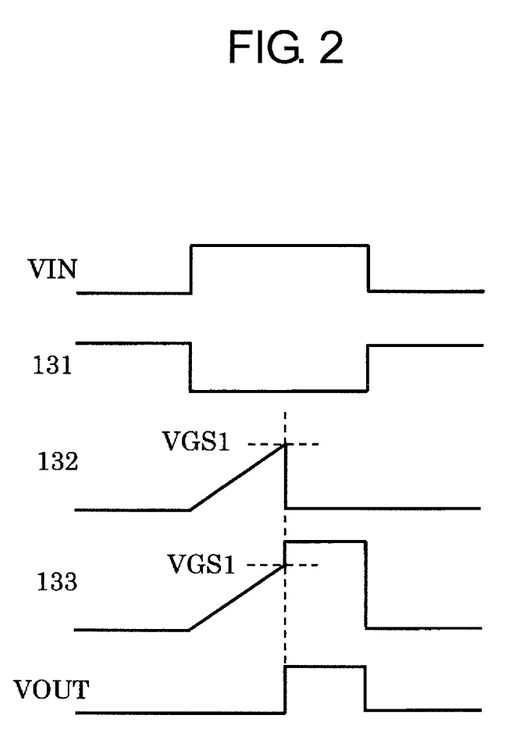
FIG. 2 is a timing chart for illustrating operation of the delay circuit of this embodiment.

Next, operation of the delay circuit of this embodiment is described. FIG. 2 is a timing chart for illustrating the operation of the delay circuit of this embodiment.

The depletion type NMOS transistor 116 and the resistor 115 form a constant current circuit. After a power supply voltage VDD of the power supply terminal 101 is raised, when a voltage of the input terminal VIN is Low, a voltage of the node 131 becomes High to turn on the NMOS transistor 112. Consequently, the capacitor 117 is discharged, and the node 132 becomes Low. The NMOS transistor 121 is also turned on, and the node 133 becomes Low. The inverter 119 outputs High in response to the voltage of the node 133 to turn on the NMOS transistor 114. The inverter 120 outputs Low in response to a signal from the inverter 119, and a voltage of the output terminal VOUT becomes Low.

When the voltage of the input terminal VIN is changed to High, the voltage of the node 131 becomes Low to turn off the NMOS transistors 112 and 121. The capacitor 117 starts to be charged when the NMOS transistors 112 and 121 are turned off, and hence the voltages of the node 132 and the node 133 are increased. It is assumed that a gate-source voltage of the depletion type NMOS transistor 116 is represented by VGS1. When the voltage of the node 132 is increased to exceed VGS1, the depletion type NMOS transistor 113 is turned off, and the voltage of the node 133 becomes High. The inverter 119 outputs the signal of Low in response to the voltage of the node 133 to turn off the NMOS transistor 114. The inverter 120 outputs the signal of High in response to the signal from the inverter 119, and the voltage of the output terminal VOUT becomes High. Then, the NMOS transistor 118 is turned on, and the voltage of the node 132 becomes Low. In this manner, a time (Td) from a time point at which the voltage of the input terminal VIN is changed from Low to High to when the gate-source voltage of the depletion type NMOS transistor 116 is exceeded is delayed, to thereby change the voltage of the output terminal VOUT from Low to High.

When a resistance value of the resistor 115 is represented by Rdly and a capacitance value of the capacitor 117 is represented by Cdly, a charge current Ichg for charging the capacitor 117 is expressed as follows.

[Math. 1]
$$Ichg = VGS1/Rdly \qquad (\text{式 1})$$

The delay time Td is expressed as:
[Math. 2]
$$Td = Cdly \times VGS1/Ichg \qquad (\text{式 2})$$

and is expressed as follows from Expression 1.
[Math. 3]
$$Td = Cdly \times Rdly \qquad (\text{式 3})$$

The parameters for determining the delay time Td are, as understood from Expression 3, only the capacitance value of the capacitor 117 and the resistance value of the resistor 115. Therefore, the delay time can be highly accurately set by adjusting the capacitor 117 and the resistor 115.

After that, when the voltage of the input terminal VIN is changed to Low and the operation of the delay circuit is cancelled, the voltage of the node 131 becomes High to turn on the NMOS transistors 112 and 121. Then, the voltage of the node 133 becomes Low, and the voltage of the output terminal VOUT is changed to Low.

As described above, in the delay circuit of this embodiment, the delay time can be determined by the parameters, namely, only the capacitor 117 and the resistor 115, and hence a highly accurate delay time can be obtained by adjusting only the capacitor 117 and the resistor 115.

Note that, the presence/absence and the connection relationship of the inverters 111, 119, and 120 are not limited to this circuit as long as a desired logic is satisfied.

Figure 3:
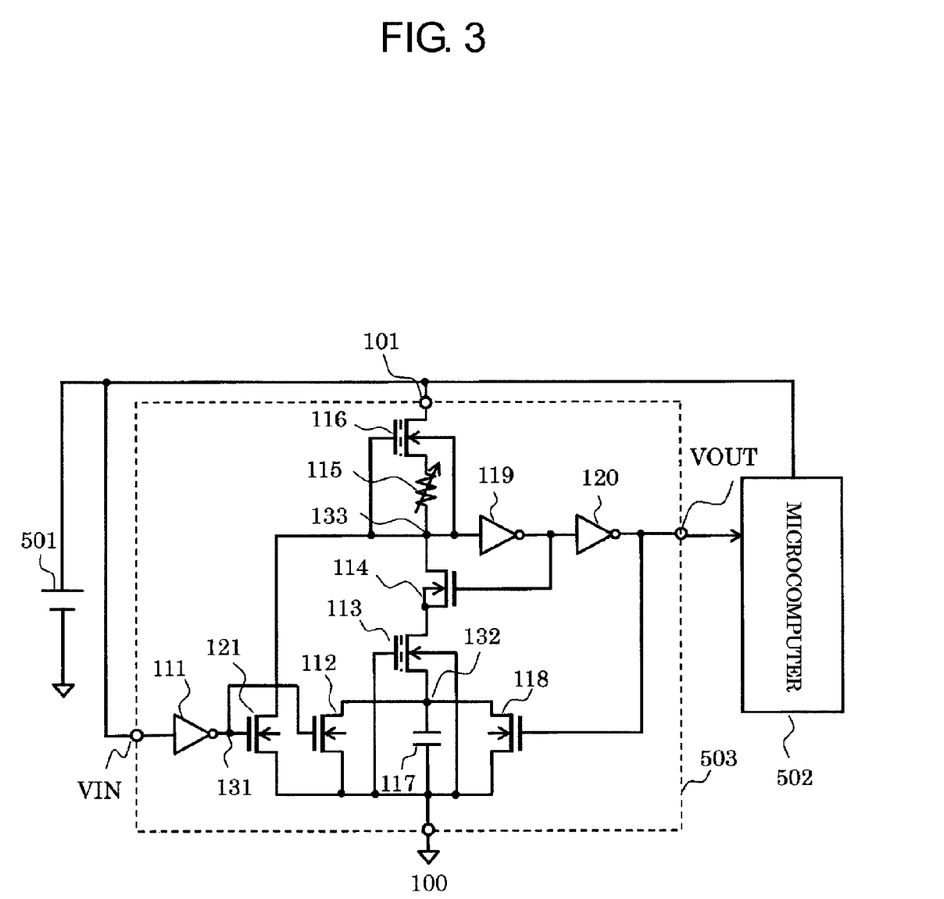
FIG. 3 is a circuit diagram for illustrating an example of a semiconductor device using the delay circuit of this embodiment.

FIG. 3 is a circuit diagram for illustrating an example of a semiconductor device using the delay circuit of this embodiment. The semiconductor device illustrated in FIG. 3 includes a power supply 501, a microcomputer 502 to be powered on by the power supply 501, and a delay circuit 503.

Next, operation of the semiconductor device using the delay circuit of this embodiment is described.

If the microcomputer 502 has such a configuration that an internal circuit thereof cannot immediately start its operation after the power supply 501 is turned on, when only a power supply voltage is input to the microcomputer 502, the microcomputer 502 cannot start its operation normally and may get out of control. The delay circuit 503 has an output terminal connected, for example, to a reset terminal of the microcomputer 502. The delay circuit 503 operates as illustrated in FIG. 2. Specifically, when the voltage of the input terminal VIN is changed to High, the voltage of the output terminal VOUT is changed from Low to High after a predetermined delay time has elapsed. When a voltage of the reset terminal becomes High, the microcomputer 502 is released from the reset state. The predetermined delay time is set to a period of time with which the microcomputer 502 can ready to start the operation stably. Consequently, the microcomputer 502 can start the operation normally.

As described above, the semiconductor device illustrated in FIG. 3 has such a configuration that, after the power supply 501 is turned on, the microcomputer 502 starts the operation in response to a delay signal generated by the delay circuit 503, and hence the microcomputer 502 can start the operation stably and an erroneous operation thereof can be prevented.

Note that, referring to FIG. 3, the semiconductor device using the microcomputer is described as an example, but the present invention is not limited to the microcomputer and is applicable to any circuit which requires a delay time for starting its operation after the power supply is turned on.

Figure 6:
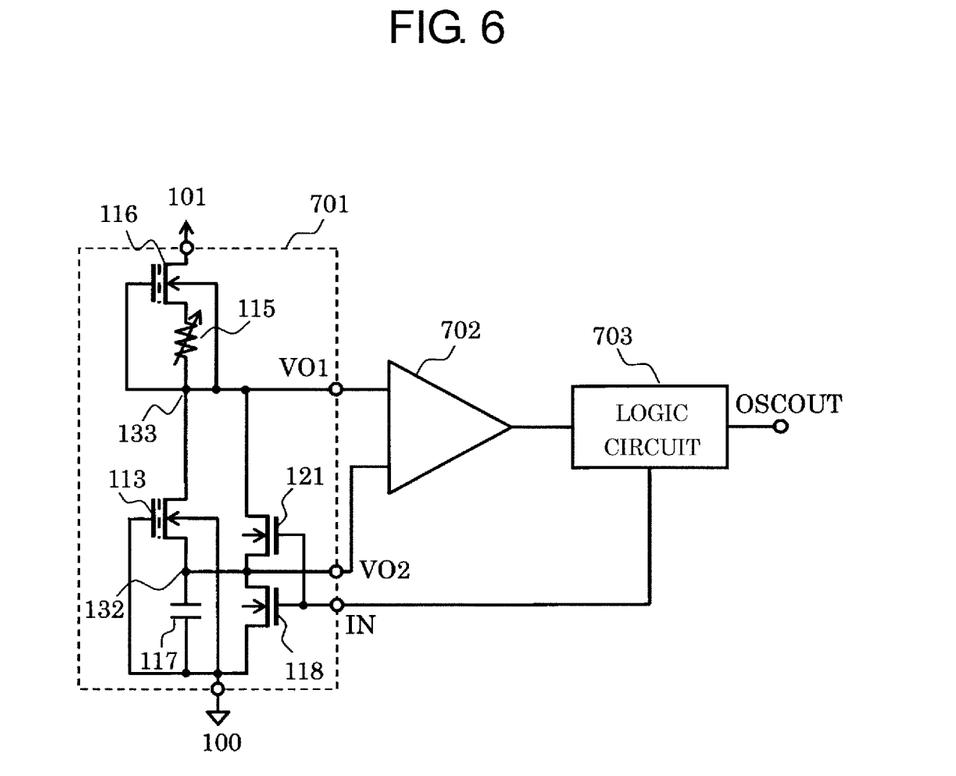
FIG. 6 is a circuit diagram for illustrating an example of an oscillator circuit using the delay circuit of this embodiment.

FIG. 6 is a circuit diagram for illustrating an example of an oscillator circuit using the delay circuit of this embodiment. The oscillator circuit illustrated in FIG. 6 includes a delay circuit 701, a comparator 702, a logic circuit 703, and an output terminal OSCOUT.

The delay circuit 701 to be used in the oscillator circuit is obtained by eliminating the inverters 111, 119, and 120 and the NMOS transistors 112 and 114 from the delay circuit of FIG. 1. Further, terminals of the delay circuit 701 include an input terminal IN, output terminals VO1 and VO2, the power supply terminal 101, and the ground terminal 100. This NMOS transistor 121 and the NMOS transistor 121 described above have different connection relationships, but are denoted by the same reference symbol because the functions thereof are the same.

In the delay circuit 701, the node 133 is connected to the output terminal VO1, the node 132 is connected to the output terminal VO2, and the input terminal IN is connected to the gates of the NMOS transistors 118 and 121. The output terminals VO1 and VO2 of the delay circuit 701 are connected to input terminals of the comparator 702. An output terminal of the comparator is connected to an input terminal of the logic circuit 703. An output terminal of the logic circuit 703 from which an oscillation signal is output is connected to an output terminal of the oscillator circuit, and an output terminal of the logic circuit 703 from which a control signal is output is connected to the input terminal IN of the delay circuit 701.

In this case, the comparator 702 has a first input terminal to which the output terminal VO1 is connected and a second input terminal to which the output terminal VO2 is connected. An offset is provided to the first input terminal and an output signal of the comparator 702 is inverted when a voltage of the first input terminal becomes higher than a voltage of the second input terminal by an offset voltage VOF. Moreover, the logic circuit 703 is configured such that the control signal obtains a desired pulse width when the output signal of the comparator 702 is inverted. That is, the logic circuit 703 is configured to divide a frequency of the output signal of the comparator 702 such that an oscillation signal having a desired frequency is output to the output terminal OSCOUT.

Figure 7:
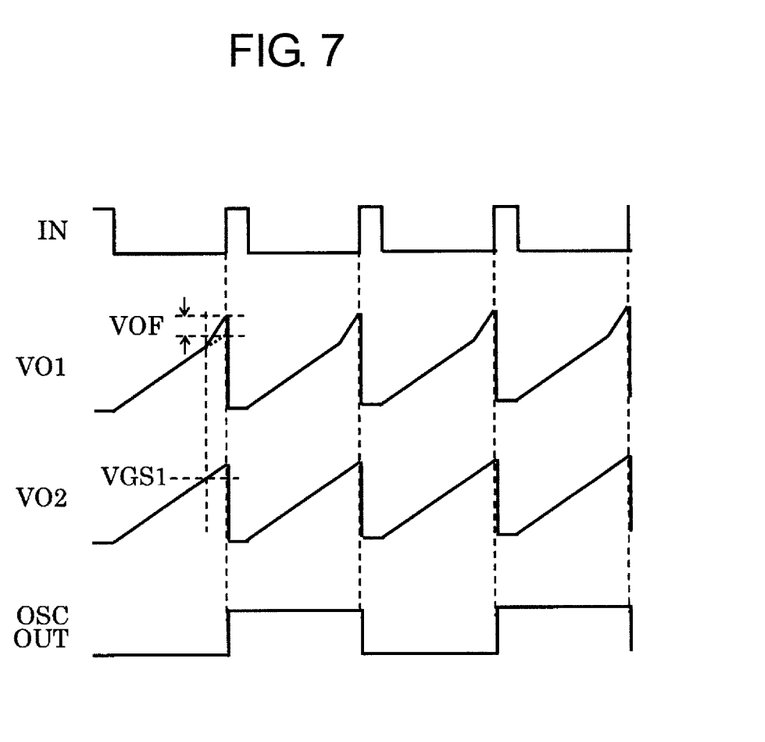
FIG. 7 is a timing chart for illustrating operation of the oscillator circuit of FIG. 6.

FIG. 7 is a timing chart for illustrating operation of the oscillator circuit of FIG. 6.

When the oscillator circuit is activated, High is input to the input terminal IN of the delay circuit 701 to initialize the delay circuit 701. Then, the voltages of the nodes 132 and 133 become Low and the voltages of the output terminals VO1 and VO2 thus become Low. Low is output from the output terminal of the comparator 702 in which an offset is provided to the first input terminal, for example. When the output signal of the comparator 702 and the control signal of the logic circuit 703 have the same logic, Low is input to the input terminal IN of the delay circuit 701, to thereby start charging of the capacitor 117.

When a voltage between both ends of the resistor 115 is represented by VGS1, the voltages of the nodes 132 and 133 are increased at the same rate until reaching the voltage VGS1. Then, when the voltage of the node 132 reaches the voltage VGS1, the voltage of the node 133 is rapidly increased. The output signal of the output terminal of the comparator 702 is inverted when a difference between the voltages of the node 132 and the node 133 becomes equal to or more than the offset voltage VOF. At this time, when the output signal of the comparator 702 becomes Low, the logic circuit 703 waits until a desired pulse width is obtained and then sets the control signal to Low. The oscillator circuit repeats the above-mentioned operation involving causing the logic circuit 703 to divide the frequency of the output signal of the comparator 702, to thereby output an oscillation signal having a desired frequency.

As described above, the oscillator circuit of this embodiment includes the delay circuit capable of obtaining a highly accurate delay time, and hence an oscillator circuit with a simple configuration and good accuracy can be provided.

Note that, the oscillator circuit of this embodiment is configured as illustrated in FIG. 6. However, the present invention is not limited to the configurations of the comparator 702 and the logic circuit 703 and is applicable to any circuit which detects the output voltage of the delay circuit 701 to perform the control as described above.

What is claimed is:

1. A delay circuit, comprising:
   a first NMOS transistor including a source connected to a ground terminal, and a gate to which an input signal is input;
   a capacitor connected between a drain of the first NMOS transistor and the ground terminal;
   a constant current circuit configured to cause a current to flow through the capacitor;
   a first inverter including an input connected to an output terminal of the constant current circuit;
   a second inverter including an input connected to an output terminal of the first inverter;
   a first depletion type NMOS transistor including a gate and a back gate each connected to the ground terminal, and a source connected to the drain of the first NMOS transistor;
   a second NMOS transistor including a source connected to the ground terminal, a drain connected to the output terminal of the constant current circuit, and a gate to which the input signal is input;
   a third NMOS transistor including a gate connected to the output terminal of the first inverter, a source and a back gate each connected to a drain of the first depletion type NMOS transistor, and a drain connected to the output terminal of the constant current circuit; and
   a fourth NMOS transistor including a source connected to the ground terminal, a gate connected to an output terminal of the second inverter, and a drain connected to the drain of the first NMOS transistor,
   the constant current circuit comprising:
      a second depletion type NMOS transistor; and
      a resistor connected between each of a gate and a back gate of the second depletion type NMOS transistor and a source of the second depletion type NMOS transistor.

2. A semiconductor device, comprising:
   the delay circuit of claim 1; and
   a circuit to be controlled by a signal output from the delay circuit.

3. A delay circuit, comprising:
   an input terminal;
   a first output terminal;
   a second output terminal;
   a constant current circuit including an input terminal connected to a power supply terminal, and an output terminal connected to the first output terminal;
   a first depletion type NMOS transistor including a gate and a back gate each connected to a ground terminal, and a drain connected to the output terminal of the constant current circuit;
   a capacitor connected between the ground terminal and each of a source of the first depletion type NMOS transistor and the second output terminal;
   a first NMOS transistor including a gate connected to the input terminal, and a drain connected to the output terminal of the constant current circuit; and
   a second NMOS transistor including a gate connected to the input terminal, a drain connected to a source of the first NMOS transistor, and a source connected to the ground terminal, the constant current circuit comprising:
- a second depletion type NMOS transistor; and
- a resistor connected between each of a gate and a back gate of the second depletion type NMOS transistor and a source of the second depletion type NMOS transistor.

4. An oscillator circuit, comprising:

the delay circuit of claim 3; and a logic circuit configured to output a signal for controlling the delay circuit, to the input terminal of the delay circuit in response to output signals output from the first output terminal and the second output terminal of the delay circuit.

5. A semiconductor device, comprising the oscillator circuit of claim 4.

* * * * *